(12) United States Patent
Rajagopal et al.

(10) Patent No.: US 11,789,071 B2
(45) Date of Patent: Oct. 17, 2023

(54) HIGH SPEED INTEGRATED CIRCUIT TESTING

(71) Applicant: TEXAS INSTRUMENTS INCORPORATED, Dallas, TX (US)

(72) Inventors: Devraj Matharampallil Rajagopal, Bangalore (IN); Nitesh Mishra, Chakeri (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 14 days.

(21) Appl. No.: 17/321,470

(22) Filed: May 16, 2021

(65) Prior Publication Data

US 2022/0221512 A1 Jul. 14, 2022

Related U.S. Application Data

(60) Provisional application No. 63/136,523, filed on Jan. 12, 2021.

(51) Int. Cl.
G01R 31/317 (2006.01)
G01R 31/3177 (2006.01)
H01L 21/78 (2006.01)
H01L 21/66 (2006.01)

(52) U.S. Cl.
CPC ... G01R 31/31727 (2013.01); G01R 31/3177 (2013.01); H01L 21/78 (2013.01); H01L 22/20 (2013.01)

(58) Field of Classification Search
CPC .......... G01R 31/31727; G01R 31/3177; H01L 21/78; H01L 22/20

USPC ....... 714/731, 718, 719, 724, 733, 736, 742, 714/744

See application file for complete search history.

(56) References Cited

U.S. PATENT DOCUMENTS

| | | | | |
|---|---|---|---|---|
| 6,003,142 A * | 12/1999 | Mori | ................... | G06F 11/2236 714/E11.166 |
| 6,073,244 A * | 6/2000 | Iwazaki | .................. | G06F 1/324 713/322 |
| 6,076,171 A * | 6/2000 | Kawata | ..................... | G06F 1/08 713/322 |
| 6,359,655 B1 * | 3/2002 | Van Vignau | ....... | H04N 5/44504 348/461 |
| 6,359,809 B1 * | 3/2002 | Tedrow | .................. | G11C 5/145 365/233.5 |
| 6,512,506 B1 * | 1/2003 | Shimada | ................ | G09G 3/367 349/94 |
| 7,444,570 B2 * | 10/2008 | Gaskins | .............. | G06F 11/2236 714/724 |
| 7,772,910 B2 * | 8/2010 | Lee | ........................ | G06F 1/3203 327/407 |
| 9,298,572 B2 * | 3/2016 | Ahmed | .............. | G01R 31/3177 |
| 2002/0067737 A1 * | 6/2002 | Wego | .................... | H04L 12/403 370/442 |

(Continued)

*Primary Examiner* — John J Tabone, Jr.
(74) *Attorney, Agent, or Firm* — Ronald O. Neerings; Frank D. Cimino

(57) ABSTRACT

An integrated circuit. The integrated circuit includes: (i) a clocked circuit operable in response to a clock; (ii) a clock providing circuit, coupled to clock the clocked circuit at a selectable frequency; (iii) a test circuit coupled to the clock providing circuit and the clocked circuit; and (iv) a pad configured to receive an external signal, wherein the selectable frequency is selected in response to the external signal.

30 Claims, 4 Drawing Sheets

(56) References Cited

U.S. PATENT DOCUMENTS

| | | | | |
|---|---|---|---|---|
| 2002/0162042 | A1* | 10/2002 | Goodrich, III | H03L 7/16 |
| | | | | 713/500 |
| 2003/0020529 | A1* | 1/2003 | Nakanishi | H03K 5/1506 |
| | | | | 327/295 |
| 2004/0213060 | A1* | 10/2004 | Naso | G11C 29/16 |
| | | | | 365/201 |
| 2004/0217791 | A1* | 11/2004 | Konuk | H03K 3/70 |
| | | | | 327/165 |
| 2005/0270890 | A1* | 12/2005 | Kim | G11C 11/4076 |
| | | | | 365/194 |
| 2006/0158272 | A1* | 7/2006 | Shirotori | H03K 5/1252 |
| | | | | 331/74 |
| 2007/0047688 | A1* | 3/2007 | Sung | H03D 13/001 |
| | | | | 375/375 |
| 2008/0082884 | A1* | 4/2008 | Harada | G01R 31/31724 |
| | | | | 714/E11.169 |
| 2008/0212574 | A1* | 9/2008 | Andre | H04J 3/0664 |
| | | | | 370/356 |
| 2011/0016346 | A1* | 1/2011 | Lee | G06F 1/12 |
| | | | | 713/503 |
| 2011/0115570 | A1* | 5/2011 | Chang | H03L 7/099 |
| | | | | 331/1 R |
| 2011/0204940 | A1* | 8/2011 | Kanda | H03L 7/093 |
| | | | | 327/156 |
| 2015/0293556 | A1* | 10/2015 | Chang | G11C 17/18 |
| | | | | 327/291 |
| 2017/0090536 | A1* | 3/2017 | Schreiner | G06F 1/08 |
| 2018/0004541 | A1* | 1/2018 | Jang | G06F 13/4022 |
| 2019/0178938 | A1* | 6/2019 | Jin | G01R 31/3167 |
| 2021/0119634 | A1* | 4/2021 | Yang | H03L 7/087 |
| 2022/0221512 | A1* | 7/2022 | Rajagopal | G01R 31/31727 |

\* cited by examiner

HIGH SPEED INTEGRATED CIRCUIT TESTING

CROSS-REFERENCE TO RELATED APPLICATION

This application claims the benefit of and priority to U.S. Provisional Application No. 63/136,523, filed Jan. 12, 2021, which is hereby fully incorporated herein by reference.

BACKGROUND

The example embodiments relate to high speed integrated circuit (IC) testing.

An IC may include one or more primary functional blocks. For example, IC memory circuits may exist in standalone form or as embedded as part of an IC that provides additional functionality beyond information storage. High speed screening of such IC circuits is indispensable in order to detect performance loss caused by both process variations and parametric defects. With respect to memory testing, one prior art testing form occurs once the IC memory has been encapsulated or packaged. Because packaging typically occurs at a much later stage in circuit design, such testing also necessarily is delayed in the design cycle. Accordingly, IC memory testing at the post-packaging stage provides inherent limitations or inefficiencies, as compared to earlier design process testing. Additionally, post-package testing depending on the implementation can also involve manual steps that may be slower and more prone to testing error, as compared to automated based testing. Another prior art form of memory testing may occur pre-packaging, when each IC memory is still part of a wafer, that is, before each IC is diced from the wafer. In this testing form, often automated test equipment (ATE) is used in conjunction with additional apparatus, to advance testing probes to contact, and then test, one IC memory on the wafer at a time. The apparatus steps or advances the probes, and the testing methodology, from one IC to the next. The results of each test are processed and typically stored, so that each tested IC memory may be assigned a score or the like that identifies the performance ability of the IC memory, sometimes referred to as binning of each IC, as ICs within comparable result distributions are then assigned to a same bin (e.g., strong, typical, weak etc.). However, robust memory testing would be achieved by memory testing at speeds up to (or exceeding) the specified memory operational speed, while current ATE testing approaches may fall short of testing at such speed. While the above describes memory by way of example, similar considerations may apply to other IC functional blocks that require high speed testing.

Example embodiments are provided in this document that may improve on certain of the above concepts, as detailed below.

SUMMARY

In one example embodiment, there is an integrated circuit. The integrated circuit includes: (i) a clocked circuit operable in response to a clock; (ii) a clock providing circuit, coupled to clock the clocked circuit at a selectable frequency; (iii) a test circuit coupled to the clock providing circuit and the clocked circuit; and (iv) a pad configured to receive an external signal, wherein the selectable frequency is selected in response to the external signal.

Other aspects and embodiments are also disclosed and claimed.

DETAILED DESCRIPTION

Figure 1A:
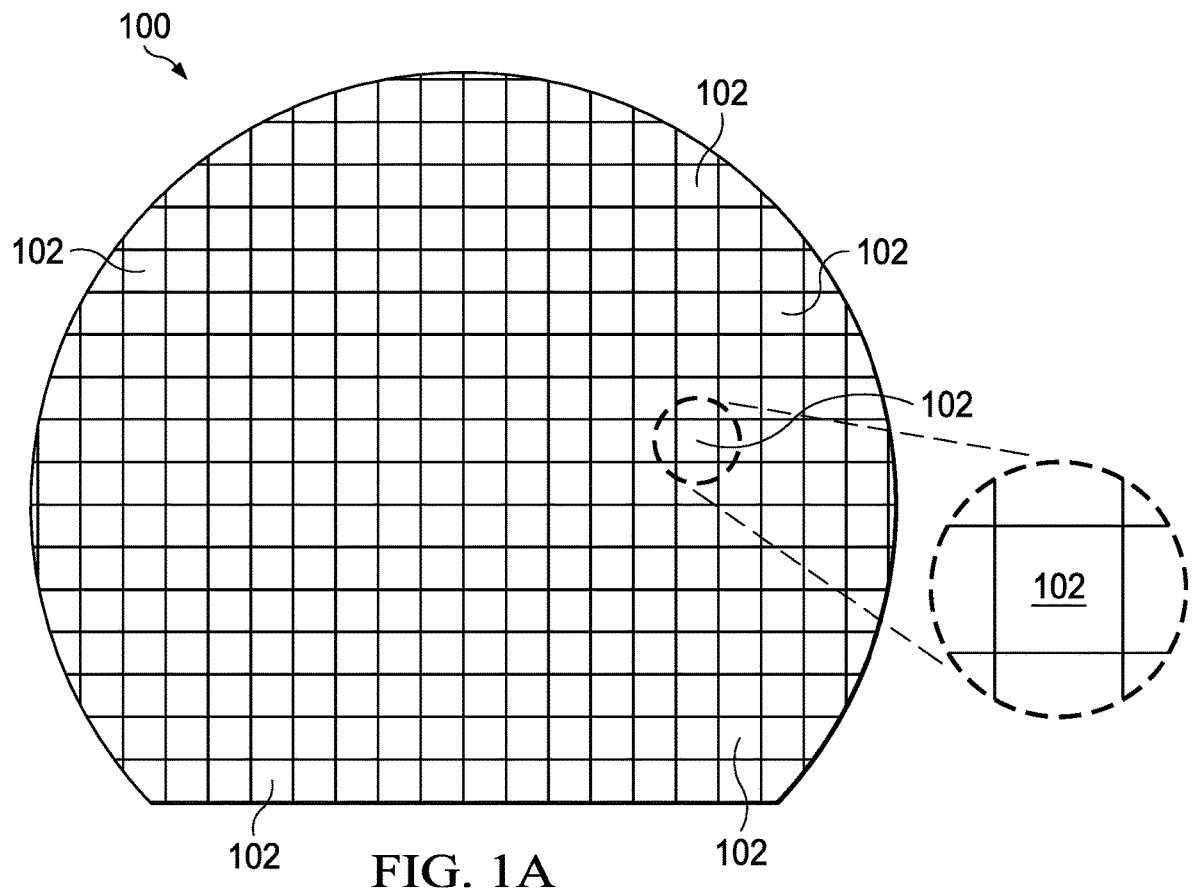
FIG. 1A illustrates a semiconductor wafer with plural ICs.

FIG. 1A illustrates a semiconductor wafer 100, typically formed from silicon. Portions of the semiconductor wafer 100 are concurrently processed to form respective same-shaped regions, each providing a respective IC 102 (only some are labeled to simplify the Figure). In an example embodiment, each IC 102 may be either a standalone memory circuit or an IC having functionality including but also extending beyond memory storage, for example with a memory in support of that functionality. The memory may be of various types, including as examples static random access memory (SRAM), read only memory (ROM), dynamic random access memory (DRAM), and either variants of these or others. In another example embodiment, each IC 102 may be either a standalone or multipurpose circuit that includes some other form of clocked circuit that requires high speed testing, such as a clocked combinational logic circuit. Accordingly, in the case of memory, combinational logic, or some other clocked circuit, the IC 102 includes additional aspects to facilitate testing of the clocked circuit(s). Further, memory may form a critical component of the IC, and it is discussed below as an example, but various teachings in this document may apply to other such IC clocked circuit(s).

When the semiconductor wafer 100 is still in the FIG. 1A general form, some or all of the ICs 102 on the wafer may be tested, for example by partially or fully-automated testing apparatus that positions a probe or probes to electrically contact a singular (or a few) IC 102. The testing apparatus then executes one or more test sequences, and the testing results may be stored or indicated. In an example embodiment, the testing includes testing operational speed for the memory portion of the IC 102, and a resultant test score (or grade) is indicated or scored. For example, an IC process design may anticipate a memory that performs at a certain speed SP, so the test may evaluate operation at that speed. Additionally, if the IC 102 does not pass the performance test at the full speed SP, the test may include additional tests at below 100% of SP, as further detailed later. Once an IC 102 is fully tested, the testing apparatus advances to probe a next individual IC 102 and execute the testing steps, and this process repeats for each IC 102 so that ultimately all ICs 102 on the wafer 100 are tested. Thereafter, each IC 102 is separated from the semiconductor wafer 100 and from one another, with the test results associated with each IC 102 then used to direct the use of each IC 102. For example, for any IC 102 that fully fails its test (e.g., either no operational speed or one below any acceptable percentage of SP), the IC can be discarded or tested further, for example in an effort to identify either design or process issues that caused the test failure. Non-failing ICs, however, can be separated into different groups depending on what percent of operational speed, relative to SP, the respective IC attained during the wafer testing. Each different performing group is then identified for potential different treatment, for example for sales into different end applications based on such performance.

Figure 1B:
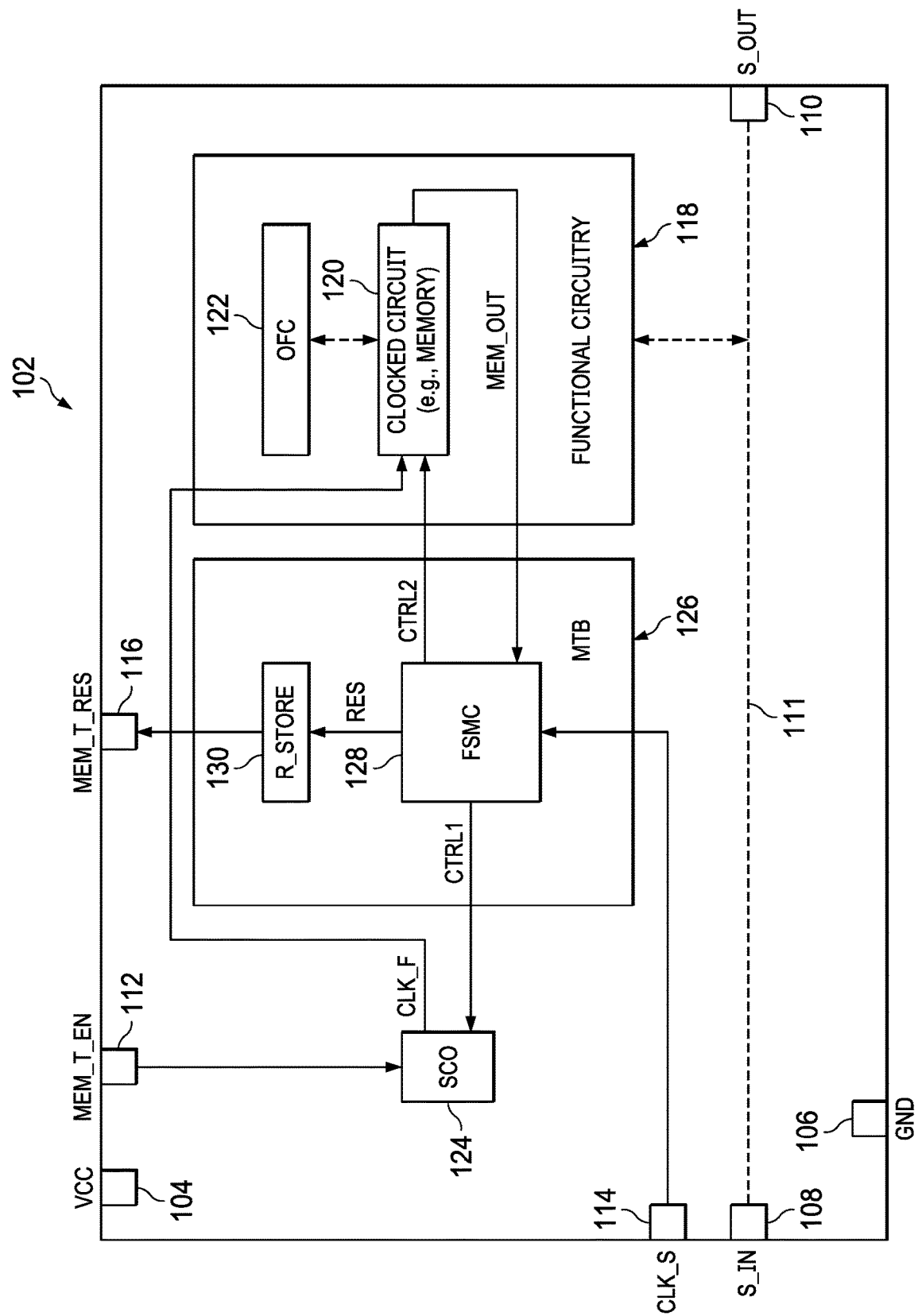
FIG. 1B illustrates additional detail of each IC from FIG. 1A.

FIG. 1B illustrates the FIG. 1A IC 102 in more detail, with it understood that the FIG. 1B depiction is replicated numerous times for respective region indicated in FIG. 1A. The IC 102 includes a first through seventh physical pad 104, 106, 108, 110, 112, 114, and 116, respectively, although example embodiment ICs may have any number of pads. Each of these physical pads is a point for communicating an electrical signal during testing, either for an analog or digital (single or multi-bit) signal. Some or all of these physical pads may be coupled to a respective package pin (not shown) when the IC 102 is packaged, for additional access to the conductive path of the pad during post-manufacture operation of the IC 102 in its final form. Also, the physical location of the pads may not necessarily be as represented in FIG. 1B.

Functionality of each of the pads 104, 106, 108, 110, 112, 114, and 116 are introduced as follows. The first pad 104 is for receiving a supply voltage (VCC), and the second pad 106 is for receiving a low reference voltage, such as ground (GND). The third pad 108 is for receiving an input signal S_IN, and the fourth pad 110 is for providing an output signal S_OUT, where each of the input and output signals can be of various types, such as voltage, current, or data, depending on the functionality of the IC 102. In general, a signal path 111 exists between the input signal S_IN and the output signal S_OUT. The signal path 111 is illustrated as a dashed line, as it is not necessarily a same node throughout the IC 102, but represents a general path through blocks that may be connected to different devices and other signal paths. The fifth pad 112 is for enabling and/or facilitating an internal memory test and is accordingly shown to receive an externally-provided input enabling signal MEM_T_EN. The sixth pad 114 is for coupling a relatively slow clock, CLK_S, in the range of 1 MHz to 10 MHz (easily achieved by a very low cost testing (VLCT) equipment), with the speed being indicated as relatively low compared to a faster memory testing clock, CLK_F, described later. CLK_S may be provided externally, for example by ATE, or from an on-chip clock circuit, to a memory testing block (MTB) 126 that is on the IC 102 and described later. The seventh pad 116 is for providing a signal representative of the memory test result and accordingly is shown to provide an output signal MEM_T_RES.

The IC 102 also includes functional circuitry 118. The functional circuitry 118 includes at least a clocked circuit 120, which in an example embodiment is a memory, which may be the sole or dominant functional circuit in the IC 102, if the IC 102 is a standalone memory device. The clocked circuit 120, as introduced earlier, may be one of various memory types, including SRAM, ROM, or DRAM, and it also may include any number or levels of memory blocks and with each memory block having any number of input/output ports. Optionally, the IC 102 also may include other functional circuitry (OFC) 122. The OFC 122 represents various different options of on-chip functionality that may work in conjunction with, or supported by, the clocked circuit 120. For example, the IC 102 may be a system on a chip (SoC), an application specific IC, or a processor (including microcontroller, microprocessor, and digital signal processor).

The IC 102 also includes testing circuitry, including a signal controlled oscillator (SCO) 124 and a clocked circuit testing circuit, such as the above-introduced MTB 126 when the clocked circuit 120 is a memory. The SCO 124 is coupled to receive the input signal MEM_T_EN and, in response, to output a variable high frequency clock CLK_F, that is as introduced earlier, having a frequency faster than that of the slow clock, CLK_S, received at the sixth pad 114. The SCO 124 may be a digital controlled oscillator (DCO), which receives two inputs: (i) a current input sufficient to power the oscillator across a range of CLK frequencies CLK[min] to CLK [max]; and (ii) a multi-bit digital control word that selects the CLK frequency, to be output as CLK_F, in the range between and including CLK[min] to CLK [max]. In this regard, the input signal MEM_T_EN may provide either or both of the current input and the digital control word, or the digital control word may be provided internally by the MTB 126, as detailed below. The CLK_F is coupled to at least the clocked circuit 120 of the functional circuitry 118. The MTB 126 includes a finite state machine and controller (FSMC) 128 and a result store (R_STORE) block 130. The FSMC 128 is an example embodiment hardware circuit for sequencing the testing of the clocked circuit 120, and it also may provide the multi-bit digital control word, shown as a first control CTRL1, to the SCO 124 in order to select the SCO 124 output CLK_F frequency, between and including CLK[min] to CLK [max]. Generally, then, the FSMC 128 is clocked by CLK_S, and the FSMC 128 outputs CTRL1 to the SCO 124, where CTRL1 is or includes the digital control word to select the CLK_F frequency. The FSMC 128 also outputs a second control CTRL2 to the clocked circuit 120, where CTRL2 sequences through test sequences (e.g., data values at different memory addresses when the clocked circuit 120 is a memory), and the clocked circuit 120 responsively outputs a test sequence, shown as MEM_OUT in the case of the clocked circuit 120 as memory, to the FSMC 128 for each input sequence. Further, the FSMC 128 is coupled to output a test (e.g., memory test) result RES to the R_STORE block 130, which is a suitable digital storage element, such as a register. In an example embodiment, the RES may represent a pass/fail indicator, or some other qualitative grade for the clocked circuit 120, in which case the MTB 126 serves as a built-in self-grading apparatus. The RES (or grade) stored in the R_STORE block 130 is coupled to the seventh pad 116 and thereby provides RES as the output signal MEM_T_RES, that is, so the test grade can be read externally from the IC 102.

Figure 2:
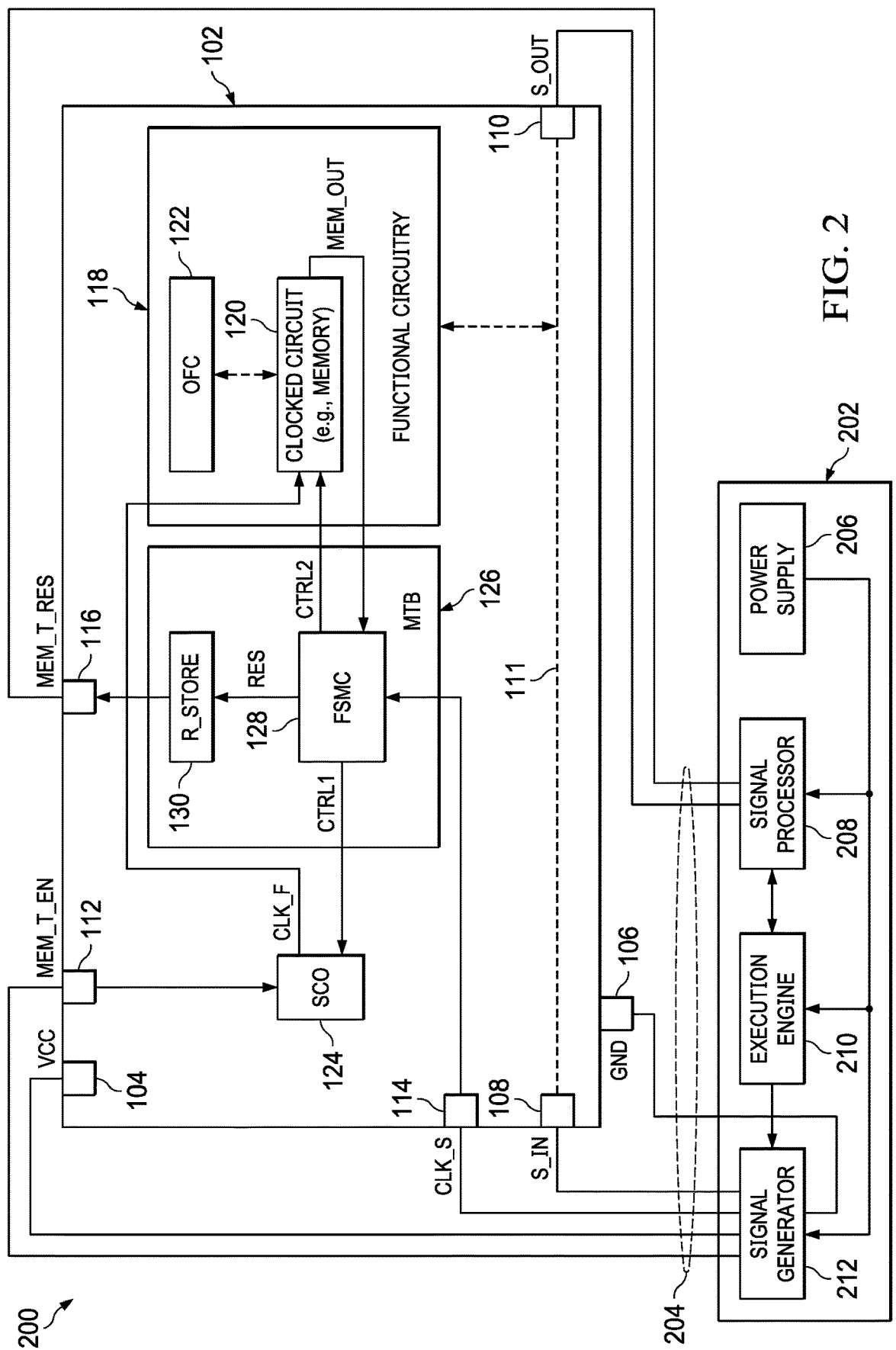
FIG. 2 illustrates a schematic of an example embodiment of an IC testing environment for testing the IC of FIG. 1A.

FIG. 2 illustrates a schematic of an example embodiment of an IC testing system 200 for testing the IC 102 of FIG. 1A. Parts of the testing system 200 can be embodied, in part or whole, with various commercially-available or developed general-purpose automated test equipment (ATE) 202, including VLCT equipment. For this reason, in FIG. 2, the reference of ATE 202 is generally to various components outside of the IC 102, again to contemplate that some of the testing apparatus and method can be part of, or facilitated by, the ATE 202. Generally, the ATE 202 provides an interface 204 by which the ATE 202 and the IC 102 are connected to each other. Further, the ATE 202 is shown in simplified form to include a power supply 206, a signal processor 208, an execution engine 210, and a signal generator 212. The power supply 206 provides power to the ATE 202 components and also may provide power and/or a ground reference to the IC 102, both shown by example as connections to the first and second pads 104 and 106. The execution engine 210 is one or more processing devices, such as a microprocessor and/or digital signal processor (DSP), that can access and execute program instructions stored in a non-transitory computerreadable program storage medium, such as internal or external memory or magnetic media (e.g., hard or flash drive), replaceable storage media, networked media, or the like. Such execution by the execution engine 210 sequences through an IC test program that causes signals to be applied to, and read from, the IC 102. Particularly, the execution engine 210 controls the signal generator 212 to apply signals from one or more of various analog or digital resources, which can provide analog or digital voltage, current, frequency or other signals to the IC 102. Accordingly, the signal generator 212 is externally connected to provide the input signal MEM_T_EN to the fifth pad 112 and the CLK_S to the sixth pad 114, to enable memory testing, and the signal processor 208 is connected to read the RES output as the signal MEM_T_RES from the seventh pad 116. Additionally in support of other testing, the signal generator 212 can apply the signal S_IN to the third pad 106 of the IC 102, and the signal processor 208 may read S_OUT from the fourth pad 110.

Figure 3:
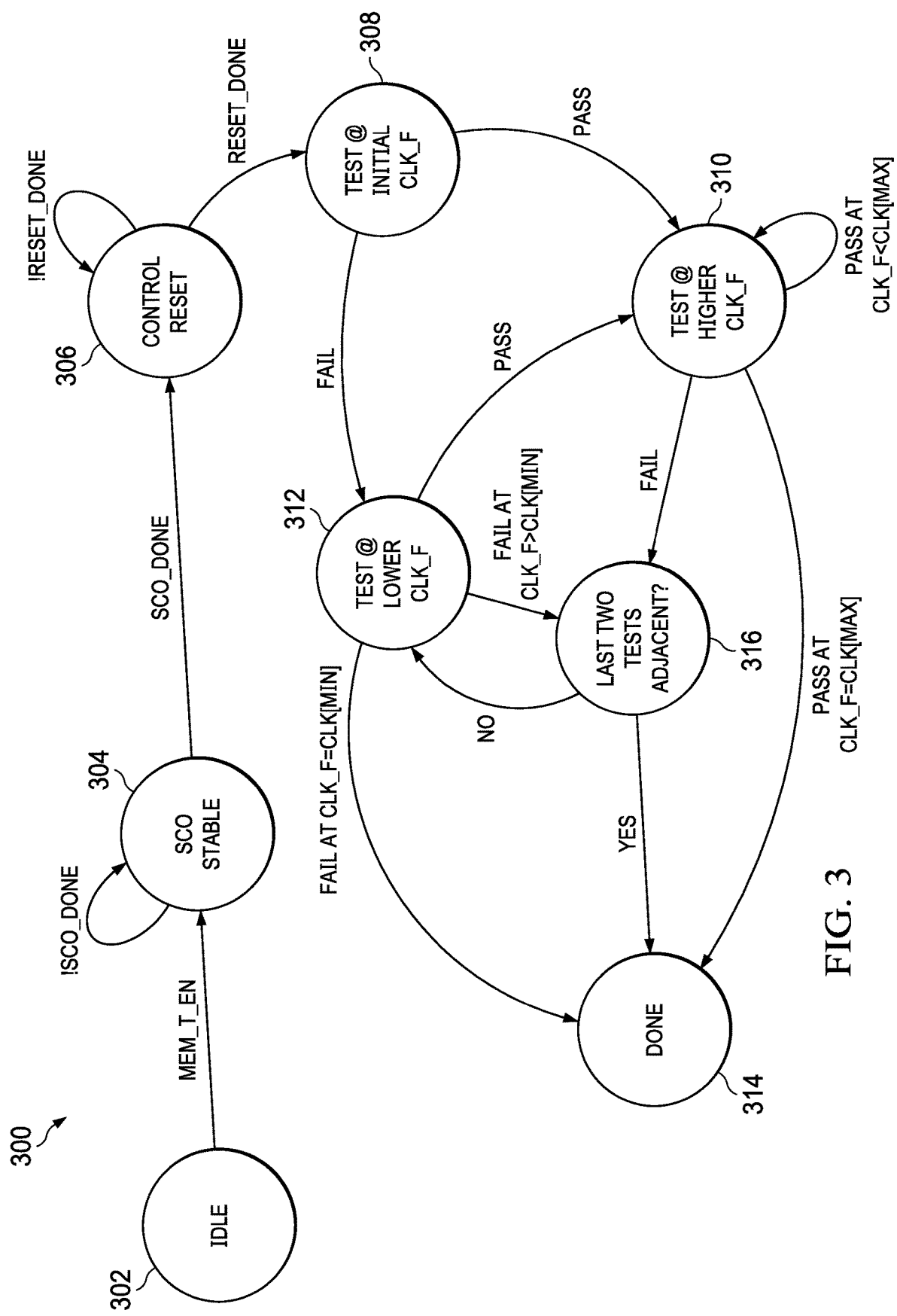
FIG. 3 illustrates a state diagram of the operation of the FIG. 2 MTB and memory portions of the IC.

FIG. 3 illustrates a state diagram 300 of the operation of the FIG. 2 MTB 126, as may be sequenced by its FSMC 128 and at the frequency provided by CLK_S. The state diagram 300 commences with a first state 302, in which portions of the MTB 126 are idle and no IC clocked circuit 120 test is occurring. For example during the first state 302, CLK_F can be inhibited by not enabling the SCO 124, or by gating off the SCO 124 output. The MTB 126 remains in the first state 302, until MEM_T_EN is enabled, as may be achieved by the FIG. 2 signal generator 212 providing an enabling current to the fifth pad 114, which connects that enabling current to the SCO 124. In response, the state diagram 300 proceeds from the first state 302 to a second state 304.

In the second state 304, the SCO 124 begins to output its CLK_F, or its CLK_F is coupled forward, as enabled by the state 302 signal (current) and further in response to a digital input word, for example provided as part, or as the entirety, of CTRL1 from the FIG. 2 FSMC 128. In an example embodiment, the CLK_F frequency in the second state 304 is the approximate midpoint between the frequencies CLK [min] to CLK[max]. For example, assume that CLK[min]=160 MHz and CLK [max]=460 MHz. Also in the example, assume that the SCO 124 control word CTRL1 is four bits, thereby operable to select from among a total of 16 different frequencies ($2^4$=16), evenly spaced from CLK [min] to CLK[max], so that CTRL=0000 selects the CLK_F frequency at CLK[min]=160 MHz, CTRL1=0001 selects the CLK_F frequency at the next higher evenly spaced 20 Mhz increment of 180 MHz, CTRL1=0010 selects the CLK_F frequency at the next higher evenly spaced 20 Mhz increment of 200 MHz, and so forth upward so that CTRL1=1111 selects the CLK_F frequency at the highest evenly spaced increment of CLK[max]=460 MHz. With this example, in the second state 304, CTRL1=1000, which is the approximate midpoint given the even number of 16 different selectable frequencies, so an alternative approximate midpoint could be CTRL1=0111. Accordingly, the SCO 124 is thereby controlled by CTRL1=1000 to output CLK_F at a frequency of 320 MHz. The MTB 126 remains in the second state 304 until the SCO 124 CLK_F frequency settles to that frequency, and that pre-settlement condition is indicated by the condition of !SCO_DONE. Once the SCO 124 CLK frequency settles to the CTRL1-indicated frequency, which is shown to occur in FIG. 3 as the condition of SCO_DONE, the state diagram 300 proceeds from the second state 304 to a third state 306.

In the third state 306, a control portion of the FSMC 128 is reset, so as to prepare for the test of the clocked circuit 120 at the current control-word specified CLK_F frequency (e.g., 320 MHz, in the example set forth thus far). Until the reset is complete, the state diagram 300 remains in the third state 306, as indicated by the condition of !RESET_DONE. Once the FSMC 128 is fully reset, which is shown to occur in FIG. 3 as the condition of RESET_DONE, the state diagram 300 proceeds from the third state 306 to a fourth state 308.

In the fourth state 308, the control portion of the FSMC 128 tests a number of addressable storage locations in the clocked circuit 120, where the test occurs at the CLK_F frequency currently indicated by CTRL1. While the test frequency is CLK_F, the test sequence can be controlled by CTRL2. For example, the fourth state 308 test may be performed according to known built-in-self-testing for a memory, such as the FSMC 128 sequencing through a number (or all) of the clocked circuit 120 addresses (at frequency CLK_F) by writing a known data or data pattern to memory locations at the sequenced addresses, with the sequential changes indicated through an address and data bus portion of CTRL2. Alternatively, if the clocked circuit 120 is something other than memory, the FSMC 128 sequences an appropriate test signaling via CTRL2, such as data input(s) to respective nodes of the clocked circuit 120. Additionally, the FSMC 128 test reads, via MEM_OUT, the memory (or other test) locations that were written, and the FSMC 128 compares the read values to that expected from the written values, either directly or through some other indirect method (e.g., checksum or the like). If the read values match or otherwise correspond to the written values, the clocked circuit 120 passes the test for the given CLK_F test frequency and the state diagram 300 transitions from the fourth state 308 to a fifth state 310. In contrast, if a read value does not correspond to a written value, the clocked circuit 120 fails the test for the given CLK_F test frequency and the state diagram 300 transitions from the fourth state 308 to a sixth state 312.

In the fifth state 310, the control portion of the FSMC 128 issues CTRL1 to increase the CLK_F frequency and then through CTRL2 again tests the clocked circuit 120, now at the increased CLK_F frequency. In an example embodiment, the frequency increase is performed by a binary search, that is, the fifth state 308 frequency increase is approximately halfway along the faster frequency range not yet shown to include a failed test by prior testing of the current state diagram 300 instantiation. Accordingly, because a first instance of the fifth state 310 is reached after a passed test from the fourth state 308, then that first, fifth state 310 instance occurs when the clocked circuit 120 already passed testing for CTRL1=1000, thereby also confirming the clocked circuit 120 should pass a test at all lower frequencies (CTRL1<1000). So, the clocked circuit 120 remains to be tested at frequencies above those indicated by CTRL1=1000 (CLK_F=320 MHz), such as in the range of CTRL1=1001 (CLK_F=340 MHz) to CTRL1=1111 (CLK_F=460 MHz). An approximate halfway frequency point is achieved by the halfway point of these two CTRL1 values, so a first instance of the fifth state 310 may proceed with the FSMC 128 asserting CTRL1=1100, responsively causing the SCO 124 to output a CLK_F frequency of 400 MHz, noting that the number of bits in CTRL1 and remaining untested frequencies may not provide an exact halfway point among those frequencies. Given the new test frequency (e.g., 400 MHz), the FSMC 128 again uses CTRL2 to perform the fifth state 310 write/read sequence through some or all of the clocked circuit 120 locations at the new CLK_F test frequency. If this most recent fifth state 310 test passes, and if the test has not yet been attempted at CLK[max], then the state diagram 300 returns to the fifth state 310 to again increase the CLK_F frequency to a next remaining approximate halfway point among the remaining untested frequencies and to test the clocked circuit 120 at the increased CLK_F. If the fifth state 310 continues to identify passing tests, then an eventual instantiation of the fifth state 310 reaches the last untested frequency, which is the highest achievable given the SCO 124 and the bit resolution of CTRL=1111; accordingly, the FSMC 128 causes the SCO 124 to output the CLK frequency at CLK[max], and again the clocked circuit 120 is tested, now at the maximum testable frequency (e.g., CLK[max]=460 MHz). If that maximum CLK_F frequency test is passed, then the state diagram proceeds from the fifth state 310 to a seventh state 314. Conversely, if the fifth state 310 test fails at any frequency up to and including that maximum frequency, then the state diagram 300 proceeds from the fifth state 310 to an eighth state 316.

In the sixth state 312, the control portion of the FSMC 128 issues CTRL1 to decrease the CLK_F frequency and then through CTRL2 again tests the clocked circuit 120, now at the decreased CLK_F frequency. For example, if the sixth state is reached following a failed test from the fourth state 308, then the clocked circuit 120 has been demonstrated to fail testing at the approximate upper half of the frequency testing range (e.g., CTRL1=1000 and CLK_F=300 MHz), so the sixth state 312 adjusts the frequency downward to test at a frequency in the approximate lower half of the frequency range. In an example embodiment, the frequency decrease is also performed by the binary search, so the sixth state 312 decrease is approximately halfway along the slower frequency range that has not yet been shown to include a failed test by prior testing. So, the example embodiment binary search advances to test the clocked circuit 120 at frequencies below those indicated by CTRL1=1000 (CLK_F=300 MHz), such as in the range of CTRL1=0000 (CLK_F=CLK[min]=160 MHz) to CTRL1=0111 (CLK_F=300 MHz). An approximate halfway frequency point is achieved by the halfway point of these two CTRL1 values, so a first instance of the sixth state 312 may proceed with the FSMC 128 asserting CTRL1=0011, responsively causing the SCO 124 to output a CLK_F frequency of 220 MHz. Given the new test frequency (e.g., 220 MHz), the FSMC 128 uses CTRL2 to perform the sixth state 312 write/read sequence through some or all of the clocked circuit 120 locations at the new test frequency. If this sixth state 312 test passes, then the state diagram 300 proceeds from the sixth state 312 to the fifth state 310, to again increase the CLK_F frequency to a next remaining halfway point among the remaining untested frequencies and to test the clocked circuit 120 at the increased CLK_F. If the sixth state 312 test fails, and if the test has not yet been attempted at CLK[min], then the state diagram 300 passes from the sixth state 312 to the eighth state 316. If the sixth state 312 test fails, and if the last test was at CLK[min], then the clocked circuit 120 has been determined, via the assumptions of the binary search, to be inoperable for all possible test frequencies (CLK[min] to CLK[max]), and the state diagram 300 passes from the sixth state 312 to the seventh state 314.

The eighth state 316 is reached after the clocked circuit 120 fails testing at a respective CLK frequency from either the fifth state 310 or the sixth state 312, as described above. The eighth state 316 determines whether there the failed test that caused the transition to the eighth state 316 was immediately preceded by another failed test an adjacent test frequency. Particularly, the frequency granularity for the SCO 124 is established by each successively adjacent value of the digital control word CTRL1 (e.g., 0000, 0001, 0010, etc.). The eighth state 316, therefore, determines if the last two successive test failures correspond to two successive adjacent values of the digital control word CTRL1; if this occurs, this indicates that the binary search has converged to a point where there is no additional approximate halfway frequency, between those two frequencies, at which the clocked circuit 120 can be tested, as the last two tests occurred at adjacent frequencies so there is no selectable frequency between them. Accordingly, under such conditions, the state diagram 300 proceeds from the eighth state 316 to the seventh state 314. To the contrary, if the last two successive test failures do not correspond to two successive adjacent values of the digital control word CTRL1, then the binary search has not so converged and there remains at least one more frequency, between the last two test frequencies, at which the clocked circuit 120 can be tested; under this latter condition, the state diagram 300 proceeds from the eighth state 316 to the sixth state 314 where, as described above, the FSMC 128 tests the memory at a next frequency that is lower than that at which the clocked circuit 120 was tested in the preceding test instance.

The seventh state 314 indicates a completion of the state diagram 300 states, following the FSMC 128 completing testing of the clocked circuit 120. From the various potential state diagram transitions described above, the seventh state 314 is reached after the FSMC 128 has tested the clocked circuit 120 to reach a result of either: (i) a pass at the CLK[max]; (ii) a fail at the CLK[min]; or (iii) a pass at some determined frequency that is less than CLK[max] while being unable to pass at a frequency above the determined frequency. In the seventh state, the FSMC 128 stores this frequency, or an indication corresponding to it such as a grade, as RES in the R_STORE block 130. Thereafter, the RES value can be read from the R_STORE block 130 by the FIG. 2 signal processor 208, via the seventh pad 116. While not shown, the state diagram 300 also may return from the seventh state 314 to the first state 302, so that the MTB 126 can again later test the clocked circuit 120. Indeed, in this regard an example embodiment can be applied in products that may require in-field testing, for example for speed related debug, including in post packaging implementations, so long as one or more of the test-related pads are also accessible via a pin(s) in the package.

Figure 4:
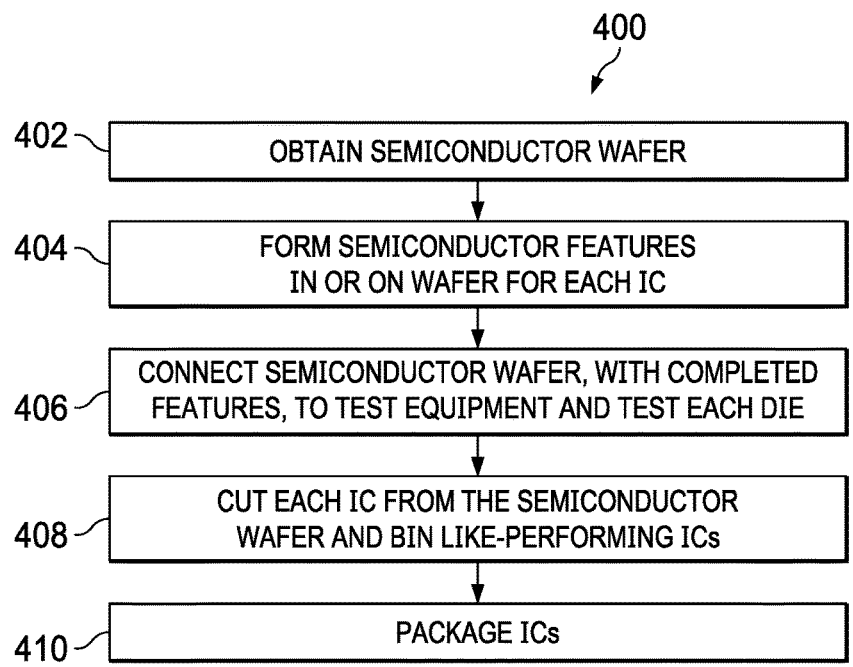
FIG. 4 illustrates a flow diagram of an example embodiment method for manufacturing the described ICs.

FIG. 4 illustrates a flow diagram of an example embodiment method 400 for manufacturing the IC 102 of FIG. 1B. The flow diagram 400 begins in a step 402, in which the FIG. 1A semiconductor wafer 100 is obtained. The semiconductor wafer 100, at this stage, may be a bare wafer or may have one or more semiconductor features already formed on it. The semiconductor wafer 100 also includes a plurality of IC regions.

Thereafter, in a step 404, one or more additional semiconductor features are formed on or in a layer(s) of the semiconductor wafer 100, with like copies of each feature formed into each respective IC 102 on the semiconductor wafer 100. The step 404 of forming the one or more additional semiconductor features may include almost any process used to form any feature. For example, the step 404 might include patterning one or more photoresist features on or in the semiconductor wafer 100, including in connection with various layers and levels. Additionally, the step 404 might include forming one or more interconnect features on or in the semiconductor wafer 100. Step 404 also may include other process steps, or a collection of different process steps, so that eventually the items shown in FIG. 1B are formed for each IC 102 on the semiconductor wafer 100.

After step 404, in a step 406 the semiconductor wafer 100 is coupled to test equipment, as shown in FIG. 2. Further, one or more of the ICs 102 on the semiconductor wafer 100 is then tested, with the testing being one (or a few) ICs at a time, and whereby each such IC is tested per its respective MTB 126, for example with respect to its respective clocked circuit 120, and per the states shown in FIG. 3. Lastly, the step 406 reads or otherwise accounts for the test result RES for each tested IC on the semiconductor wafer 100.

After step 406, in a step 408 each IC 102 is cut (diced) from the semiconductor wafer 100. In the step 406, each 102 IC may be separated according to different groups or bins, where each bin receives any IC having a result RES within a performance range corresponding to that bin. Further, any IC in a bin having an unacceptably low RES may be discarded, that is, not shipped as usable product to customers, but may be retained internally for additional testing, or it may be destroyed or otherwise used. For instance, in the earlier example where the clocked circuit 120 of each IC is tested against a frequency performance range of 160 MHz to 460 MHz, then it could be that those ICs with a RES of 280 MHz or lower are discarded, and those performing above that level are separated into three bins, a first bin for performance in the range of 300 MHz to 340 MHz, a second bin for performance in the range of 360 MHz to 400 MHz, and a third bin for performance in the range of 420 MHz to 460 MHz, Accordingly, ICs in a respective bin may be assigned corresponding published specifications so that each like-performing IC is ultimately implemented into a device or system based on those specifications.

Finally, in a step 410 following the step 408, the ICs are packaged. Packaging typically places a casing around (or encapsulating) the IC and further provides an external interface, typically a number of conductive pins, fixed relative to pads on the die, and conductors such as wire bonds, lands, or balls, are formed between the IC pads and the packaging pins. Thereafter, any packaged IC with an acceptable memory test result is ready for sale and shipping to a customer.

From the above, the example embodiments provide IC testing with an on-chip clock circuit that is controlled in part from external testing equipment. With aspects described, high speed testing, for example of on-chip memory, can be achieved while avoiding limits of certain prior art testing. For example, contemporary memory testing is often performed at this packaged stage, which is typically not automated and is necessarily constrained as it is late in the design process. As another example, testing earlier in the fabrication stage typically involves ATE, but there are often large capacitive loads (e.g., probe card or tester board) that may limit the speed at which a wafer-level memory may be tested, that is, with the limited frequency being below that of the nominal capability of the testable memory. So, other testing may include inferences measured from access time, which may be fundamentally questioned as it relies on assumptions that may not align with actual silicon implementation. Other approaches involve very costly equipment or make consume large amounts of time, which multiplies across very large numbers of ICs to be tested, thereby also increasing costs. In contrast, example embodiments facilitate high-speed clocked circuit testing using VLCT equipment that provides external signaling (e.g., current) that can be readily coupled to each wafer IC that is tested. Further, the test result can be provided by, or stored in, the tested IC, and then also read by the VLCT. To the extent the test result represents a grade of the memory or other clocked circuit, each IC can be readily associated with its grade and treated accordingly once singulated from the wafer. Further, the example embodiments are readily scalable to different numbers and types of memories, whereby the VLCT equipment is readily adapted to each, permitting qualification of each IC that includes a tested memory. Accordingly, example embodiments may improve on any one more of ATE input/output, probe card, and speed limitations, with little or no additional external hardware test cost and lower test effort and test time. Further, while the above-described attributes are shown in combination, the inventive scope includes subsets of one or more features in other embodiments. Still further, also contemplated are changes in various parameters, including dimensions, with the preceding providing only some examples, with others ascertainable, from the teachings herein, by one skilled in the art. Accordingly, additional modifications are possible in the described embodiments, and other embodiments are possible, within the scope of the following claims.

What is claimed is:
1. An integrated circuit, comprising:
a clocked circuit operable in response to a clock;
a clock providing circuit, coupled to clock the clocked circuit at a selectable frequency;
a test circuit coupled to the clock providing circuit and the clocked circuit; and
a pad configured to receive an external signal, wherein the selectable frequency is selected in response to the external signal.
2. The integrated circuit of claim 1, wherein the clock providing circuit includes a digital controlled oscillator.
3. The integrated circuit of claim 2, wherein the external signal includes a current to power the clock providing circuit across a range of frequencies from which the selectable frequency is selected.
4. The integrated circuit of claim 1 wherein the test circuit includes a state machine configured to sequence through a plurality of states for testing the clocked circuit at different selectable frequencies.
5. The integrated circuit of claim 4 wherein the state machine is coupled to operate at a clock frequency lower than a minimum frequency in the different selectable frequencies.
6. The integrated circuit of claim 4 wherein the state machine is coupled to receive a clock frequency signal external from the integrated circuit.
7. The integrated circuit of claim 4:
wherein the clock providing circuit is a first clock providing circuit; and
wherein the integrated circuit further includes a second clock providing circuit coupled to provide a clock signal, slower than the selectable frequency, to the state machine.
8. The integrated circuit of claim 4 wherein the test circuit includes a storage circuit configured to store an indicator of a highest frequency in the different selectable frequencies for which the testing provided a passed test.
9. The integrated circuit of claim 1, wherein the clocked circuit includes a memory.
10. The integrated circuit of claim 9, wherein the memory is selected from a group consisting of RAM and ROM.
11. The integrated circuit of claim 1, wherein the clocked circuit includes a logic circuit.

12. A testable integrated circuit system, comprising:
an integrated circuit, the integrated circuit including:
a clocked circuit operable in response to a clock;
a clock providing circuit, coupled to clock the clocked circuit at a selectable frequency;
a test circuit coupled to the clock providing circuit and the clocked circuit; and
a pad configured to receive an external signal, wherein the selectable frequency is selected in response to the external signal; and
external test equipment coupled to the integrated circuit.

13. The testable integrated circuit system of claim 12, wherein the external test equipment couples the external signal to the integrated circuit.

14. A method of testing an integrated circuit, the method comprising:
receiving an external signal to the integrated circuit;
on the integrated circuit and responsive to the external signal, generating a plurality of different frequency clock signals;
coupling each of the different frequency clock signals to a clocked circuit on the integrated circuit; and
storing on the integrated circuit a pass/fail indicator representing a test of the clocked circuit at a corresponding one of the different frequency clock signals.

15. The method of claim 14 wherein the receiving step includes receiving a current as the external signal.

16. The method of claim 15 and further including providing the current as the external signal.

17. The method of claim 15 and further including operating automated test equipment to provide the current as the external signal.

18. The method of claim 14 wherein the generating step further includes generating the plurality of different frequency clock signals further in response to a respective digital signal or signals.

19. The method of claim 18 and further including a step of generating the respective digital signal or signals on the integrated circuit.

20. The method of claim 19 wherein the digital signal or signals is one of a digital control word and a multi-bit digital control word.

21. The method of claim 18 wherein the digital signal or signals is one of a digital control word and a multi-bit digital control word.

22. A method of manufacturing an integrated circuit, the method comprising:
obtaining a semiconductor wafer;
forming features in the semiconductor wafer for each of a plurality of integrated circuits;
for each integrated circuit in the plurality of integrated circuits:
receiving an external signal to the integrated circuit;
on the integrated circuit and responsive to the external signal, generating a plurality of different frequency clock signals;
coupling each of the different frequency clock signals to a clocked circuit on the integrated circuit; and
storing on the integrated circuit a pass/fail indicator representing a test of the clocked circuit at a corresponding one of the different frequency clock signals.

23. The method of claim 22 wherein the receiving step includes receiving a current as the external signal.

24. The method of claim 23 and further including providing the current as the external signal.

25. The method of claim 23 and further including operating automated test equipment to provide the current as the external signal.

26. The method of claim 22 wherein the generating step further includes generating the plurality of different frequency clock signals further in response to a respective plurality of digital signal or signals.

27. The method of claim 26 and further including a step of generating the respective plurality of digital signal or signals on the integrated circuit.

28. The method of claim 27 wherein the digital signal or signals is one of a digital control word and a multi-bit digital control word.

29. The method of claim 22 and further including:
cutting each integrated circuit in the plurality of integrated circuits from the semiconductor wafer; and
binning selected integrated circuits from the plurality of integrated circuits into a same group in response to a respective pass/fail indicator for each integrated circuit in the selected integrated circuits.

30. The method of claim 29 and further including packaging each integrated circuit in the plurality of integrated circuits.

* * * * *